United States Patent [19]

Yabe et al.

[11] Patent Number: 5,065,174

[45] Date of Patent: Nov. 12, 1991

[54] DEVELOPING MACHINE FOR PHOTOSENSITIVE FILMS AND DEVELOPING METHOD FOR PHOTOSENSITIVE FILMS

[75] Inventors: Norio Yabe; Takeshi Iijima; Kazunori Itaya; Masahide Takano, all of Higashimatsuyama, Japan

[73] Assignee: Sanyo-Kokusaku Pulp Co., Ltd., Tokyo, Japan

[21] Appl. No.: 466,945

[22] Filed: Jan. 18, 1990

[30] Foreign Application Priority Data

Jun. 7, 1989 [JP] Japan .................................. 1-144433

[51] Int. Cl.⁵ .............................................. G03D 3/00
[52] U.S. Cl. .................................... 354/222; 354/320; 354/325
[58] Field of Search ............... 354/317, 319, 320, 321, 354/322, 325; 15/77, 100, 102

[56] References Cited

U.S. PATENT DOCUMENTS

| 4,034,433 | 7/1977 | Slingsby | 15/77 |
| 4,179,208 | 12/1979 | Martino | 15/77 X |
| 4,428,659 | 1/1984 | Howard | 15/77 X |
| 4,733,260 | 3/1988 | Kubo et al. | 354/325 X |

FOREIGN PATENT DOCUMENTS 60-193551 12/1985 Japan .

Primary Examiner—A. A. Mathews
Attorney, Agent, or Firm—Oblon, Spivak, McClelland, Maier & Neustadt

[57] ABSTRACT

A developing machine for photosensitive films serviceable for both negative type and positive type films and exclusively usable for developing with water, comprising a warm water-dipping section consisting of warm water bath, a brush-developing section for developing by rubbing off the non-image area with a rotating brush roll while spraying water, and a drying section for drying with warm air, wherein the negative type photosensitive film, and non-image area being dissolved with ordinary temperature water for development, is passed through the brush-developing section and drying section, and the positive type photosensitive film, the non-image area being swollen with warm water and then rubbed off with brush for development, is passed through the warm water-dipping section, brush-developing section and drying section.

3 Claims, 2 Drawing Sheets

DEVELOPING MACHINE FOR PHOTOSENSITIVE FILMS AND DEVELOPING METHOD FOR PHOTOSENSITIVE FILMS

BACKGROUND OF THE INVENTION

The present invention relates to a developing machine for developing the photosensitive films and, in more detail, it provides a developing machine for photosensitive films characterized in that both negative type, the non-image area being dissolved with water for development, and positive type, the non-image area being dipped into water or warm water and then the swollen non-image area being rubbed off for development, are developable together on the same machine and alkali solution or organic solvent is not used at all.

As the photosensitive layers of photosensitive films forming the image by removing the non-image area, the following is known:

(1) Negative Type

Photosensitive layer comprising diazo resin, water-soluble resin, etc., wherein the image area is insolubilized into water through photo-crosslinking reaction and the image is formed by washing and removing the non-image area with water for development.

Photosensitive layer comprising azido compound, water-soluble resin, etc., wherein the image area is insolubilized into water through photo-crosslinking reaction and the image is formed by washing and removing the non-image area with water for development.

Photosensitive layer comprising modified poly(vinyl alcohol) etc. provided with a photosensitive component-adding group such as stilbazonium group, wherein the image area is insolubilized into water through photo-dimerization reaction of photosensitive component-adding group and the image is formed by washing and removing the non-image area with water for development.

Photosensitive layer comprising photo-active monomer, prepolymer or the like, wherein the image area is insolubilized into water through photo-polymerization reaction and the image is formed by washing and removing the non-image area with water for development.

Photosensitive layer comprising diazo resin, alkali-soluble resin, etc., wherein the image area is insolubilized into alkali through photo-crosslinking reaction and the image is formed by dissolving and removing the non-image area with alkali-solution for development.

Photosensitive layer comprising azido compound, alkali-soluble resin, etc., wherein the image area is insolubilized into alkali and the image is formed by dissolving and removing the non-image area with alkali solution for development.

Photosensitive layer comprising photo-active monomer, prepolymer or the like, wherein the image area is insolubilized into alkali through photo-polymerization reaction and the image is formed by dissolving and removing the non-image area with alkali solution for development.

(2) Positive Type

Photosensitive layer comprising naphthoquinonediazide compound, alkali-soluble resin, etc., wherein the decomposition products of naphthoquinonediazido compound is solubilized into alkali through exposure to light and the image is formed by dissolving and removing them with alkali solution.

On the other hand, as the developing machines for photosensitive films having been put into practical use hitherto, there are:

Machines by Alkali-Developing Method

Developing machine comprises an alkali-dipping section, a water-washing section and a drying section. The alkali-dipping section consists of a bath with alkali solution accommodated, a rotating brush roll being usually provided therein, and the non-image area is dissolved and removed here. The water washing section is a bath with washing water accommodated or a bath for washing the film with water by using a shower of flowing washing water, a rotating brush roll being usually provided therein. The drying section performs the drying with warm air. The developing machine of this type is primarily used for the film base photosensitive materials requiring development treatment with alkali and both negative and positive are developable.

Developing machine comprises an alkali-shower section, a brush-developing section, a water washing section and a drying section. The alkali-shower section dissolves and removes roughly the non-image area by using a shower spouting alkali-developing liquor, the brush-developing section removes completely the non-image area by developing with a rotating brush roll while spraying alkali-developing liquor, the water-washing section performs the washing with water spouting from a shower, and drying section performs the drying with warm air. The developing machine of this type has been made practicable as a developing machine for PS plate etc. used as an offset printing plate and both negative and positive are developable.

(2) Machines by Water-Developing Method

Developing machine comprises a brush-developing section and a drying section. The brush-developing section performs the dissolution, development and water-washing with a rotating brush roll while spraying washing water and the drying is made in the drying section. The machine is used only for the development of negative type photosensitive film developable with water.

Developing machine comprises a shower-developing section, a water-washing section and a drying section. The shower-developing section dissolves and removes the non-image areas with water spouting from a nozzle, the water-washing section performs the water-washing with a rotating brush roll while spraying washing water, and the drying section performs the drying with warm air. The machine is used only for the development of negative type photosensitive film developable with water.

Thus, as evident from above, the developing method common to negative type and positive type is limited to one with alkali solution. Consequently, as the developing machine capable of treating both negative type and positive type, alkali-developing machine alone has been put into practical use.

As a result of extensive investigations on the positive type photosensitive film capable of treating only with tap water without using alkali solution or organic solvent up to this time, the inventors have invented the positive type photosensitive film developable by rubbing off the non-image area with brush after allowing it to swell with water or warm water, as shown in Japanese Unexamined Patent Publication No. Sho 63-313148 and Sho 63-311349, Japanese Patent Application No. Sho 63-7453, etc. Further, as a result of investigations on the developing machine capable of developing this positive type photosensitive film together with the negative type photosensitive film having negative type photosensitive layer wherein the image is formed by washing with water and removing the non-image area for development (e.g. Japanese Unexamined Patent Publication No. Sho 59-65840, Sho 60-28649, Sho 61-186954, etc.), the inventors have invented a developing machine of the invention for photosensitive films.

SUMMARY OF THE INVENTION

The invention provides a developing machine for photosensitive films serviceable for both negative type and positive type films and exclusively usable for developing with water comprising a warm water-dipping section consisting of warm water bath, a brush-developing section for developing by rubbing off the non-image area with a rotating brush roll while spraying water, and a drying section for drying with warm air, wherein the negative type photosensitive film, the non-image area being dissolved with ordinary temperature water for development, is passed through the brush-developing section and drying section and the positive type photosensitive film, the non-image area being swollen with warm water and then rubbed off with brush for development, is passed through the warm water-dipping section, brush-developing section and drying section. Other embodiment is also shown.

DETAILED DESCRIPTION OF THE INVENTION

The developing machine of the invention for photosensitive films comprises a warm water-dipping section, a brush-developing section and a drying section.

The warm water-dipping section is a bath of warm water for allowing the non-image area of the photosensitive layer of positive type photosensitive film to swell, in which warm water of 20° to 50° C. is accommodated. Only positive type photosensitive film passes therethrough at a speed of being dipped into warm water of 10 to 90 sec. The warm water is prepared by warming tap water with a water-warming heater placed in the warm water-dipping section.

The brush-developing section develops by dissolving and removing the non-image area of the photosensitive layer of negative type photosensitive film with water-washing shower and rotating brush roll. Also, it removes the non-image area of the photosensitive layer of positive type photosensitive film having passed through the warm water-dipping section and being swollen with warm water by rubbing with a brush roll while spraying a water-washing shower. As the hair materials of the brush roll, nylon, acrylonitrile, polypropylene or copolymer thereof can be utilized.

Moreover, the brush roll usually rotates at a faster peripheral speed than the transfer speed of the photosensitive film and the backup roll rotates at the same peripheral speed as the transfer speed of the photosensitive film. The photosensitive film passes through between the brush roll and the backup roll and through transfer guides.

The drying section of the invention comprises drying heaters and drying fans.

In the case of the developing machine of the invention for photosensitive films, it is also possible to enhance the developability by further adding a shower-developing section or a brush-developing section between, for example, the warm water-dipping section and the brush-developing section except the warm water-dipping section, brush-developing section and drying section.

For example, when adding the shower-developing section having a shower nozzle spouting at a hydraulic pressure of higher than 1 kgf/cm$^2$ between the warm water-dipping section and the brush-developing section, such merits that denser development is possible with bath negative type photosensitive film and positive type photosensitive film, that the treatment speed becomes faster, that the load of brush-developing section can be relieved, and the like can be achieved. Further, with respect to the positive type photosensitive film, there is also an effect to prevent from a phenomenon that the removed rubbishes from the non-image area in photosensitive layer adhere to the running photosensitive film to contaminate.

Also, similar effects can be achieved by the additional installation of one more brush developing section between the warm water-dipping section and the brush-developing section.

Figure 1:
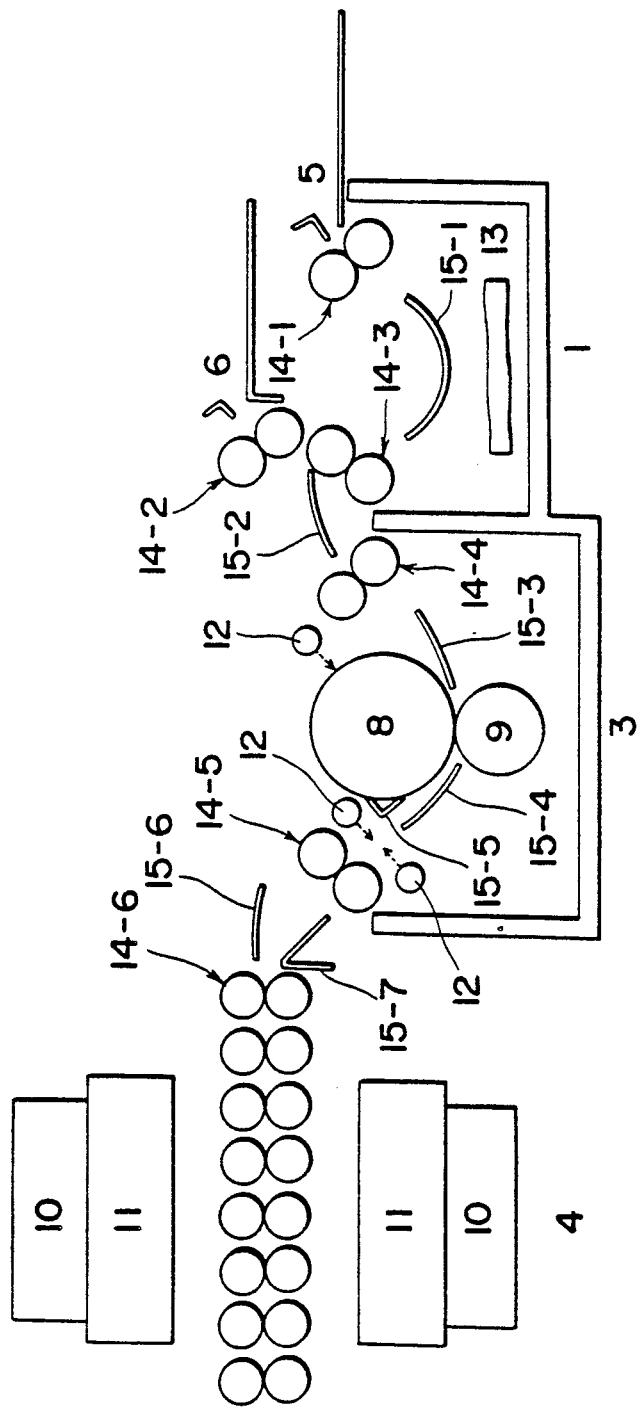
FIG. 1 is a cross section showing the constitution of the developing machine of the invention for photosensitive films comprising a warm water-dipping section, a brush-developing section and a drying section.

Furthermore, as shown in FIG. 1, transfer rolls and transfer guides are arranged inside each section and between sections for the running of photosensitive film.

In following, the examples will be shown in order to clarify further the invention.

Figure 2:
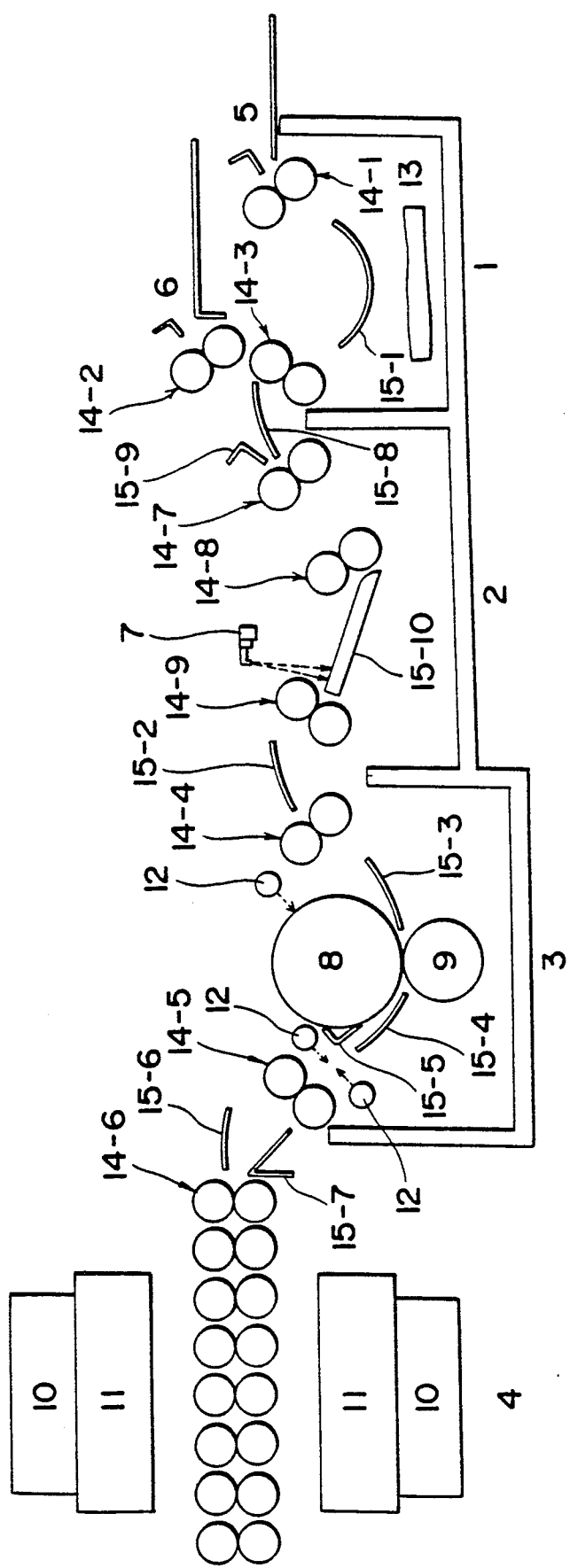
FIG. 2 is a cross section showing the constitution of the developing machine of the invention for photosensitive films comprising a warm water-dipping section, a shower-developing section, a brush-developing section and a drying section.

FIG. 1 and FIG. 2 are concerned with a few example of the developing machine of the invention for photosensitive films and the invention is not confined to these.

EXAMPLE 1

The developing machine shown in FIG. 1 comprises a warm water-dipping section 1, a brush-developing section 3 and a drying section 4. On a side of the warm water-dipping section, there is an inserting section for positive type photosensitive film 5 and, in the warm water-dipping section 1, a water-warming heater 13 is placed. Also, above the warm water-dipping section 1, there is an inserting section for negative type photosensitive film 6. Following the warm water-dipping section 1, there is the brush-developing section 3, in which a brush roll 8 rotating at two times as fast peripheral speed as the transfer speed of photosensitive film, a backup roll 9 holding the photosensitive film between it and the brush roll and rotating at the same peripheral speed as the speed of the photosensitive film, and further three water-washing showers 12 washing the brush roll 8 and running film with water are assembled. Next the drying section 4 has a pair of drying heaters 11 and drying fans 10 above and below so as to hold the photosensitive film passing through the transfer rolls 14-6 therebetween. Moreover, inside each section and between sections, each transfer roll 14 and each transfer guide 15 are disposed for the running of photosensitive film as shown in FIG. 1.

The positive type photosensitive film having finished the exposure to light for imaging is inserted into the inserting section for positive type photosensitive film 5 and the exposed non-image area is swollen in the warm water-dipping section 1. Then, when passing through between the brush roll 8 and the back-up roll 9 in the brush-developing section, the swollen non-image area is rubbed off, washed with water-washing shower 12, and dried in the drying section 4 to finish the development.

On the other hand, the negative type photosensitive film having finished the exposure to light for imaging is inserted into the inserting section for negative type photosensitive film 6. This does not pass the warm water-dipping section 1. When passing through first between the brush roll 8 and the backup roll 9 in the brush-developing section 3, the unexposed non-image area is washed with water, further washed with water-washing shower 12, and then dried in the drying section 4 to finish the development.

EXAMPLE 2

A shower-developing section 2 was added between the warm water-dipping section 1 and the brush-developing section 3 in the constitution of the developing machine for photosensitive films in Example 1. The shower-developing section removes the non-image area of the photosensitive film having finished the exposure to light for imaging and passing through on a transfer guide 15-10 with shower water spouting from a shower nozzle 7 at a hydraulic pressure of 1 kgf/cm$^2$ and almost all of the swollen non-image area of positive type photosensitive film are taken away with shower water. Also, in the case of negative type photosensitive film, unexposed non-image area is dissolved and removed. Hence, in the brush-developing section 3, the photosensitive films being successively sent, it becomes safe only to remove the non-image area in the photosensitive layer left slightly on the photosensitive film.

What is claimed is:

1. A developing machine for photosensitive films serviceable for both negative type and positive type films and exclusively usable for developing with water, comprising a warm water-dipping section consisting of a warm water bath, a shower-developing section for developing with shower spouting from a nozzle, a brush-developing section for developing by rubbing off the non-image area with a rotating brush roll while spraying water, and a drying section for drying with warm air, wherein the negative type photosensitive film, the non-image area being dissolved with ordinary temperature water for development, is passed through the shower-developing section, brush-developing section and drying section and the positive type photosensitive film, the non-image area being swollen with warm water and then rubbed off with brush for development, is passed through the warm water dipping section, shower-developing section, brush-developing section and drying section.

2. A developing machine for photosensitive films serviceable for both negative type and positive type films and usable for developing with water, comprising:
a warm water-dipping section comprising a warm water bath;
a brush-developing section for developing by rubbing off a non-image area of said photosensitive film with a rotating brush roll while spraying water; and
a drying section for drying with warm air;
a non-image area of the negative type photosensitive film being dissolved with ordinary temperature water for development and being passed through a first path defined by only the brush-developing section and the drying section;
a non-image area of the positive type photosensitive film being swollen with warm water and then rubbed off with said brush for development, and passed through a second path defined by the warm water-dipping section, the brush-developing section and the drying section.

3. A developing method for photosensitive films comprising the steps of:
swelling a non-image area of a positive type photosensitive film with warm water in a warm water-dipping section;
substantially dissolving the non-image area of the photosensitive film in a shower developing section having a shower nozzle for spouting shower water;
developing by rubbing off the remainder of the non-image area with a rotating brush roll while spraying water in a brush-developing section; and
drying with warm air in a drying section.

* * * * *